(12) United States Patent
Choi et al.

(10) Patent No.: US 11,495,302 B2
(45) Date of Patent: Nov. 8, 2022

(54) MEMORY DEVICE AND METHOD OF OPERATING THE MEMORY DEVICE

(71) Applicant: SK hynix Inc., Icheon-si (KR)

(72) Inventors: Won Jae Choi, Icheon-si (KR); Da Woon Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/228,069

(22) Filed: Apr. 12, 2021

(65) Prior Publication Data

US 2022/0115075 A1    Apr. 14, 2022

(30) Foreign Application Priority Data

Oct. 13, 2020 (KR) .................. 10-2020-0132204

(51) Int. Cl.
  *G11C 7/00* (2006.01)
  *G11C 16/26* (2006.01)
  *G11C 16/10* (2006.01)
  *G11C 16/04* (2006.01)
  *G11C 11/56* (2006.01)

(52) U.S. Cl.
  CPC .......... *G11C 16/26* (2013.01); *G11C 16/0483* (2013.01); *G11C 16/10* (2013.01); *G11C 11/5671* (2013.01)

(58) Field of Classification Search
  CPC ............ G11C 11/406; G11C 11/40615; G11C 2211/4061; G11C 11/40618; G11C 2211/4067
  USPC ....................................................... 365/222
  See application file for complete search history.

(56) References Cited

U.S. PATENT DOCUMENTS

| 2013/0185609 A1* | 7/2013 | Park .................... G06F 11/0751 |
| | | 714/E11.023 |
| 2016/0211032 A1* | 7/2016 | Pang ...................... G11C 16/26 |

FOREIGN PATENT DOCUMENTS

| KR | 101766875 B1 | 8/2017 |
| KR | 101824068 B1 | 3/2018 |
| KR | 1020190128794 A | 11/2019 |

OTHER PUBLICATIONS

Yu Cai et al., Flash Correct-and-Refresh: Retention-Aware Error Management for Increased Flash Memory Lifetime, IEEE, 2012.

* cited by examiner

*Primary Examiner* — Son T Dinh
(74) *Attorney, Agent, or Firm* — William Park & Associates Ltd.

(57) ABSTRACT

According to the present technology, a memory device may include memory cells configured to be programmed so that each of the memory cells has a threshold voltage corresponding to any one of a plurality of program states, a peripheral circuit configured to perform a read operation or a program operation on the memory cells, and control logic configured to control the peripheral circuit to perform a test read operation of reading the memory cells using a test read voltage that is any one read voltage among preset default read voltages, and perform a refresh program operation of applying a refresh program voltage to some memory cells among the memory cells according to the number of memory cells having a threshold voltage greater than the test read voltage.

20 Claims, 18 Drawing Sheets

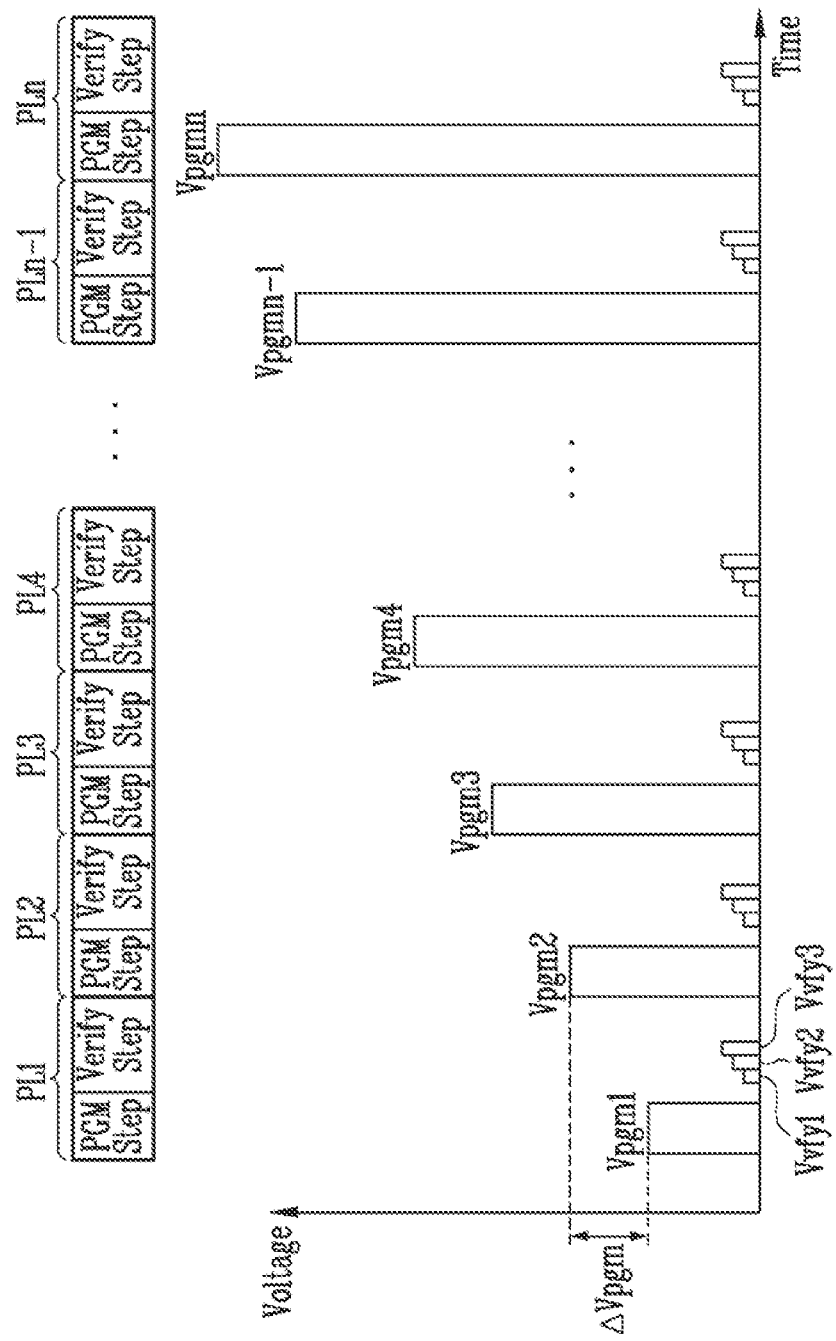

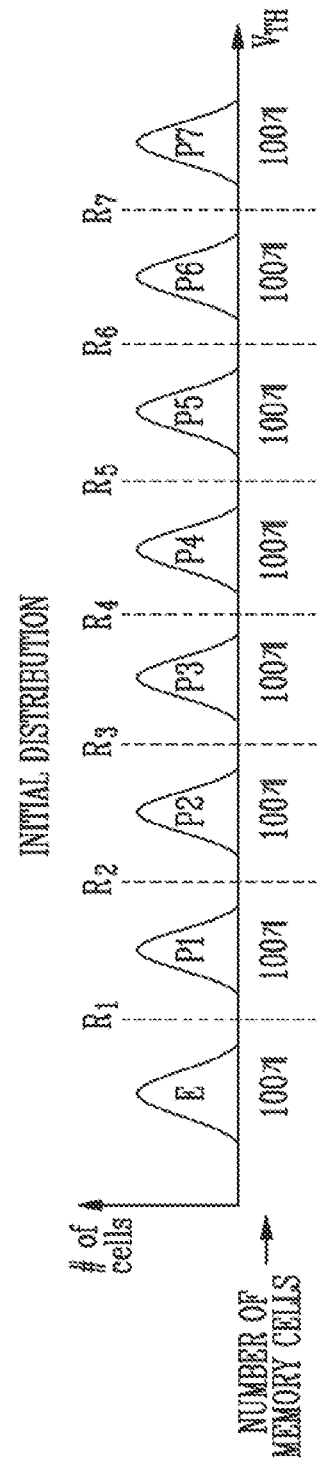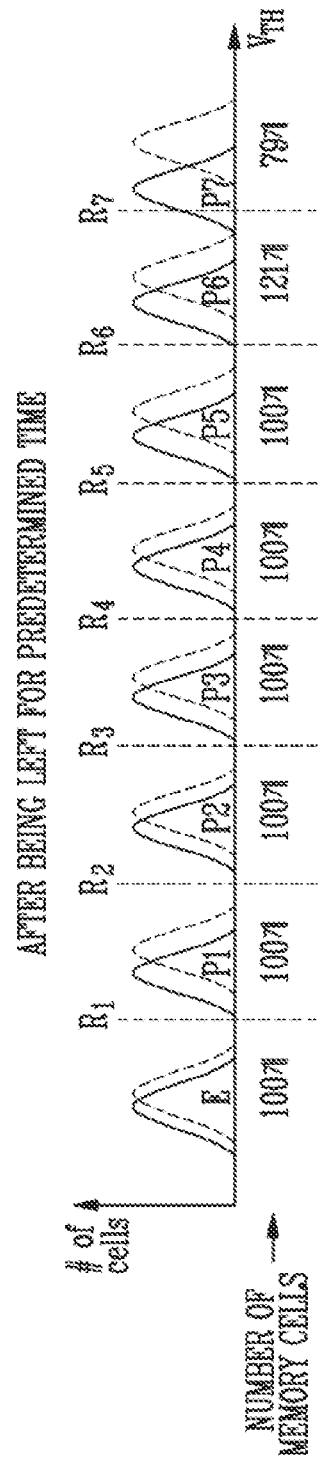

FIG. 11

| MC | MC1 | MC2 | MC3 | MC4 | MC5 | MC6 | MC7 | MC8 | MC9 |
|---|---|---|---|---|---|---|---|---|---|
| R7 | 0 | 1 | 0 | 1 | 1 | 0 | 0 | 1 | 0 |
| Vs1 | 0 | 1 | 0 | 0 | 1 | 0 | 0 | 1 | 0 |
| Vs2 | 0 | 1 | 0 | 0 | 0 | 0 | 0 | 0 | 0 |
| Vs3 | 0 | 0 | 0 | 0 | 0 | 0 | 0 | 0 | 0 |
| Refresh DATA | 0 | 1 | 0 | 1 | 1 | 0 | 0 | 1 | 0 |

Test DATA
Sampling DATA1
Sampling DATA2
Sampling DATA3
Refresh DATA

| RETENTION TIME(tret) | P1 | P2 | P3 |
|---|---|---|---|
| exceeding tm1 and equal to or less than tm2 | X | X | O |
| exceeding tm2 and equal to or less than tm3 | X | O | O |
| exceeding tm3 | O | O | O |

FIG. 16

| RETENTION TIME(tret) | P1 | P2 | P3 | P4 | P5 | P6 | P7 |
|---|---|---|---|---|---|---|---|
| exceeding tc1 and equal to or less than tc2 | X | X | X | X | X | X | O |
| exceeding tc2 and equal to or less than tc3 | X | X | X | X | X | O | O |
| exceeding tc3 and equal to or less than tc4 | X | X | X | X | O | O | O |
| exceeding tc4 and equal to or less than tc5 | X | X | X | O | O | O | O |
| exceeding tc5 and equal to or less than tc6 | X | O | O | O | O | O | O |
| exceeding tc6 and equal to or less than tc7 | X | O | O | O | O | O | O |
| exceeding tc7 | O | O | O | O | O | O | O |

FIG. 17

| RETENTION TIME(tret) | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|
| exceeding tq1 and equal to or less than tq2 | X | X | X | X | X | X | X | X | X | X | X | X | X | X | O |
| exceeding tq2 and equal to or less than tq3 | X | X | X | X | X | X | X | X | X | X | X | X | X | O | O |
| exceeding tq3 and equal to or less than tq4 | X | X | X | X | X | X | X | X | X | X | X | X | O | O | O |
| exceeding tq4 and equal to or less than tq5 | X | X | X | X | X | X | X | X | X | X | X | O | O | O | O |
| exceeding tq5 and equal to or less than tq6 | X | X | X | X | X | X | X | X | X | X | O | O | O | O | O |
| exceeding tq6 and equal to or less than tq7 | X | X | X | X | X | X | X | X | X | O | O | O | O | O | O |
| exceeding tq7 and equal to or less than tq8 | X | X | X | X | X | X | X | X | O | O | O | O | O | O | O |
| exceeding tq8 and equal to or less than tq9 | X | X | X | X | X | X | X | O | O | O | O | O | O | O | O |
| exceeding tq9 and equal to or less than tq10 | X | X | X | X | X | X | O | O | O | O | O | O | O | O | O |
| exceeding tq10 and equal to or less than tq11 | X | X | X | X | X | O | O | O | O | O | O | O | O | O | O |
| exceeding tq11 and equal to or less than tq12 | X | X | X | X | O | O | O | O | O | O | O | O | O | O | O |
| exceeding tq12 and equal to or less than tq13 | X | X | X | O | O | O | O | O | O | O | O | O | O | O | O |
| exceeding tq13 and equal to or less than tq14 | X | X | O | O | O | O | O | O | O | O | O | O | O | O | O |
| exceeding tq14 and equal to or less than tq15 | X | O | O | O | O | O | O | O | O | O | O | O | O | O | O |
| exceeding tq15 | O | O | O | O | O | O | O | O | O | O | O | O | O | O | O |

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0132204 filed on Oct. 13, 2020, in the Korean Intellectual Property Office, the entire disclosure of which is incorporated by reference herein.

BACKGROUND

1. Technical Field

The present disclosure relates to an electronic device, and more particularly, to a memory device and a method of operating the memory device.

2. Related Art

A storage device is a device that stores data under control of a host device such as a computer or a smartphone. A storage device may include a memory device storing data and a memory controller controlling the memory device. The memory device may be classified into a volatile memory device and a nonvolatile memory device.

The volatile memory device may be a device that stores data only when power is supplied and loses the stored data when the power supply is cut off. The volatile memory device may include a static random access memory (SRAM), a dynamic random access memory (DRAM), and the like.

The nonvolatile memory device is a device that does not lose data even though power is cut off. The nonvolatile memory device include a read only memory (ROM), a programmable ROM (PROM), an electrically programmable ROM (EPROM), an electrically erasable and programmable ROM (EEPROM), a flash memory, and the like.

SUMMARY

According to an embodiment of the present disclosure, a memory device may include memory cells configured to be programmed so that each of the memory cells has a threshold voltage corresponding to any one of a plurality of program states, a peripheral circuit configured to perform a read operation or a program operation on the memory cells, and control logic configured to control the peripheral circuit to perform a test read operation of reading the memory cells using a test read voltage that is any one read voltage among preset default read voltages, and perform a refresh program operation of applying a refresh program voltage to some memory cells among the memory cells according to the number of memory cells having a threshold voltage greater than the test read voltage.

According to an embodiment of the present disclosure, a method of operating a memory device including memory cells programmed so that each of the memory cells has a threshold voltage corresponding to any one of a plurality of program states may include obtaining test read data obtained by sensing the memory cells using a test read voltage that is any one read voltage among preset default read voltages, and applying a refresh program voltage to some memory cells among the memory cells according to the number of reference logic values included in the test read data.

According to an embodiment of the present disclosure, a memory device may include a memory cell array including memory cells configured to be programmed so that each of the memory cells has a threshold voltage corresponding to one of a plurality of program states, a peripheral circuit configured to perform a read operation or a program operation on the plurality of memory cells, and a refresh operation controller configured to control the peripheral circuit to perform a refresh program operation for a program state in which the number of memory cells of which a threshold voltage is decreased among the plurality of memory cells exceeds a preset reference number among the plurality of program states.

BRIEF DESCRIPTION OF THE DRAWINGS

FIG. 8 is a diagram illustrating a program operation.

FIGS. 9A and 9B are diagrams illustrating a threshold voltage change of memory cells due to retention.

FIG. 11 is a diagram illustrating a method of generating refresh data using sampling read data.

FIG. 16 is a diagram illustrating a method of determining a program state on which a refresh program operation is to be performed according to an embodiment of the present disclosure.

FIG. 17 is a diagram illustrating a method of determining a program state on which a refresh program operation is to be performed according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

An embodiment of the present disclosure provides a memory device having improved reliability and a method of operating the memory device.

According to the present technology, a memory device having improved reliability and a method of operating the memory device may be provided.

Figure 1:
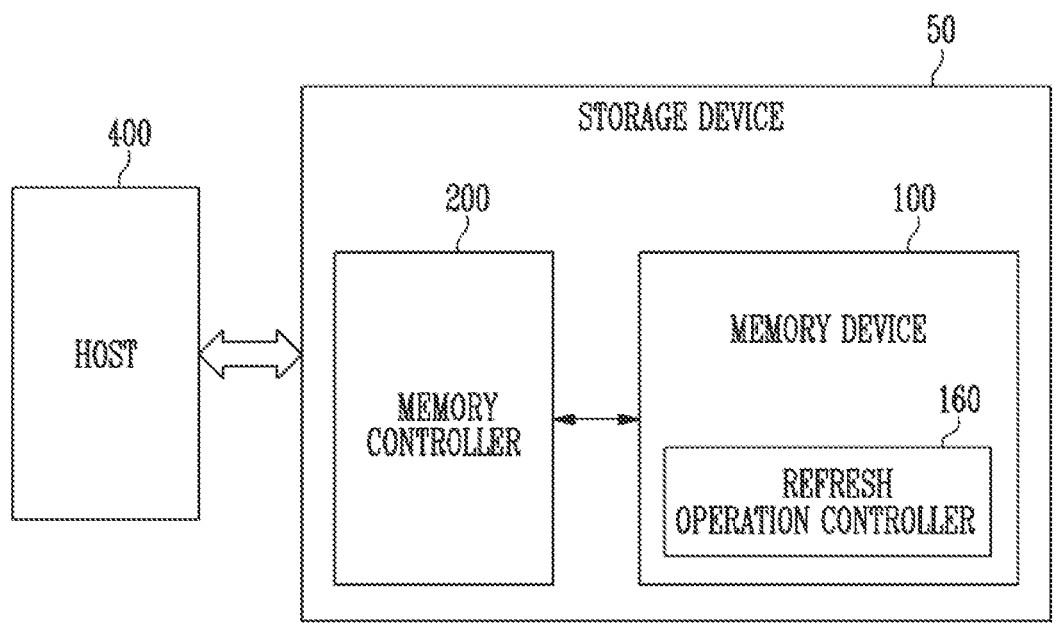
FIG. 1 is a diagram illustrating a storage device including a memory device according to an embodiment of the present disclosure.

FIG. 1 is a diagram illustrating a storage device including a memory device according to an embodiment of the present disclosure.

Referring to FIG. 1, the storage device 50 may include a memory device 100 and a memory controller 200. The storage device 50 may be a device that stores data under control of a host 400 such as a cellular phone, a smartphone, an MP3 player, a laptop computer, a desktop computer, a game player, a TV, a tablet PC, or an in-vehicle infotainment system. Alternatively, the storage device 50 may be a device that stores data under the control of the host 400 that stores high-capacity data in one place, such as a server or a data center.

The storage device 50 may be manufactured as one of various types of storage devices according to a host interface that is a communication method with the host 400. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array (not shown) including a plurality of memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits.

The memory cell array (not shown) may include a plurality of memory blocks. Each memory block may include a plurality of memory cells. Each memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area selected by the address in the memory cell array. The memory device 100 may perform an operation instructed by the command on the area selected by the address. For example, the memory device 100 may perform a write operation (program operation), a read operation, and an erase operation. During the program operation, the memory device 100 may program data in the area selected by the address. During the read operation, the memory device 100 may read data from the area selected by the address. During the erase operation, the memory device 100 may erase data stored in the area selected by the address.

The memory device 100 may include a refresh operation controller 160.

The refresh operation controller 160 may control a refresh program operation of increasing a threshold voltage of memory cells of which the threshold voltage is decreased.

The refresh operation controller 160 may receive a refresh command and a refresh address from the host 400. The refresh operation controller 160 may determine whether to perform the refresh program operation in response to the refresh command. The refresh operation controller 160 may perform a test read operation on a page corresponding to the refresh address, and determine whether to perform the refresh program operation based on a result of the test read operation. The test read operation may be a read operation using a test read voltage. The test read operation may be an operation of sensing memory cells included in the page corresponding to the refresh address using the test read voltage. The test read voltage may be some read voltages among default read voltages that are read voltages set as a default value of the memory device 100. For example, when the memory cell included in the memory device 100 stores two or more bits, data stored in the memory cell may be sensed using a plurality of default read voltages. In an embodiment, the test read voltage may be some read voltages among default read voltages that are read voltages preset as a default value of the memory device 100 (i.e., preset default read voltages). The test read voltage may be any one read voltage among the plurality of default read voltages. In an embodiment, the test read voltage may be a read voltage that distinguishes between a highest program state and a program state adjacent to the highest program state among a plurality of program states that the memory cells may have. The word "preset" as used herein with respect to a parameter, such as a preset default read voltages or preset reference number, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The refresh operation controller 160 may count the number of reference logic values included in test data obtained by the test read operation. Here, the reference logical value may be "0" or "1". In an embodiment, the reference logic value may be sensing data of a memory cell having a threshold voltage higher than the test read voltage. That is, the reference logic value may be data indicating a memory cell read as an off-cell.

When the number of reference logic values included in the test data obtained by the test read operation is less than a first reference number, the refresh operation controller 160 may perform the refresh program operation. When the number of reference logic values included in the test data obtained by the test read operation is equal to or greater than the first reference number, the refresh operation controller 160 might not perform the refresh program operation.

The refresh operation controller 160 may perform a sampling read operation to determine the memory cells on which the refresh program operation is to be performed. The sampling read operation may be performed a plurality of times. The refresh operation controller 160 may generate refresh data indicating the memory cells on which the refresh program operation is to be performed by using sampling data obtained through the sampling read operation and the test data obtained through the test read operation.

The refresh operation controller 160 may perform the refresh program operation using refresh data. A refresh program voltage applied during the refresh program operation may be related to the number of times the sampling read operation is performed.

A specific content of the refresh program operation performed by the refresh operation controller 160 is described in with reference to FIGS. 9A to 15 to be described later.

The memory controller 200 may control an overall operation of the storage device 50.

When power is applied to the storage device 50, the memory controller 200 may execute firmware (FW). When the memory device 100 is a flash memory device, the memory controller 200 may execute firmware such as a flash translation layer (FTL) for controlling communication between the host 400 and the memory device 100.

In an embodiment, the memory controller 200 may receive data and a logical address (LA) from the host 400 and may convert the LA into a physical address (PA) indicating an address of memory cells in which data included in the memory device 100 is to be stored.

The memory controller 200 may control the memory device 100 to perform the program operation, the read operation, or the erase operation according to a request of the host 400. During the program operation, the memory controller 200 may provide a program command, the PA, and data to the memory device 100. During the read operation, the memory controller 200 may provide a read command and the PA to the memory device 100. During the erase operation, the memory controller 200 may provide an erase command and the PA to the memory device 100.

In an embodiment, the memory controller 200 may generate a command, an address, and data on independently regardless of the request from the host 400 and transmit the command, the address, and the data to the memory device 100. For example, the memory controller 200 may provide the command, the address, and the data for performing a program operation, a read operation and a erase operation accompanying in performing wear leveling, read reclaim, garbage collection, and the like, to the memory device 100.

In an embodiment, the memory controller 200 may convert write data received from the host 400 into program data. The program data may be data converted so that the number of data corresponding to each of a plurality of program states determined according to the number of bits that may be stored in each of the memory cells included in the memory device 100 have the same ratio. For example, assuming that each of the memory cells may store two bits of data, the program data may be data obtained by converting the write data so that data corresponding to each of an erase state and first to third program states are included by ¼. Alternatively, assuming that each of the memory cells may store three bits of data, the program data may be data obtained by converting the write data so that data corresponding to each of an erase state and first to seventh program states are included by ⅛. Through this, the memory controller 200 may prevent the memory cells included in the memory device 100 or the memory cells configuring the page from being programmed mainly to specific program states. In addition, since the program data is data converted so that each of states may be evenly programmed, security of the data may be strengthened.

In an embodiment, the memory controller 200 may further include a data converter (not shown) for converting the write data into the program data.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other.

The host 400 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
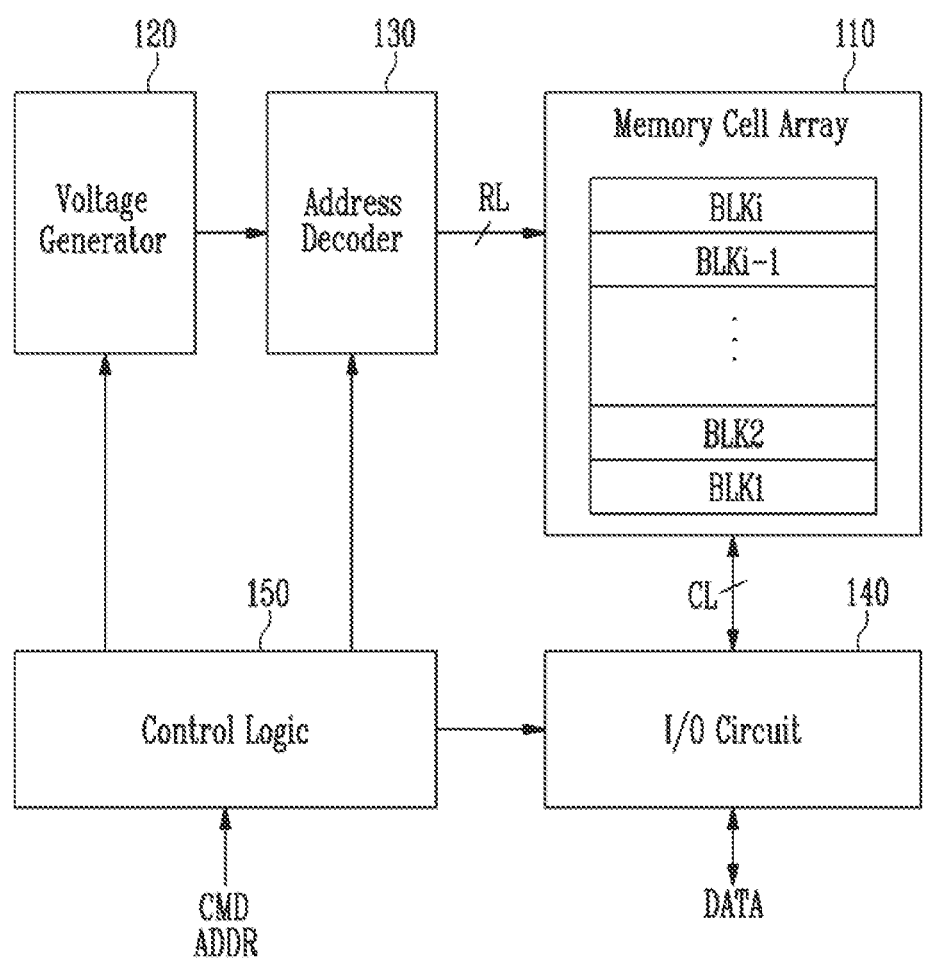
FIG. 2 is a diagram illustrating the memory device of FIG. 1.

FIG. 2 is a diagram illustrating the memory device of FIG. 1.

Referring to FIG. 2, the memory device 100 may include a memory cell array 110, a voltage generator 120, an address decoder 130, an input/output circuit 140, and control logic 150. The control logic 150 may be implemented as hardware, software, or a combination of hardware and software. For example, the control logic 150 may be a control logic circuit operating in accordance with an algorithm and/or a processor executing control logic code.

The memory cell array 110 includes a plurality of memory blocks BLK1 to BLKi. The plurality of memory blocks BLK1 to BLKi are connected to the address decoder 130 through row lines RL. The plurality of memory blocks BLK1 to BLKi may be connected to the input/output circuit 140 through column lines CL. In an embodiment, the row lines RL may include word lines, source select lines, and drain select lines. In an embodiment, the column lines CL may include bit lines.

Each of the plurality of memory blocks BLK1 to BLKi includes a plurality of memory cells. In an embodiment, the plurality of memory cells may be nonvolatile memory cells. Memory cells connected to the same word line among the plurality of memory cells may be defined as one physical page. That is, the memory cell array 110 may include a plurality of physical pages. Each of the memory cells of the memory device 100 may be configured as an SLC that stores one data bit, an MLC that stores two data bits, a TLC that stores three data bits, or a QLC capable of storing four data bits.

Some of the plurality of memory blocks BLK1 to BLKi may be map data block storing map data described with reference to FIG. 1. The remaining of the plurality of memory blocks BLK1 to BLKi may be a normal block storing data requested by the host 400.

In an embodiment, the voltage generator 120, the address decoder 130, and the input/output circuit 140 may be collectively referred to as a peripheral circuit. The peripheral circuit may drive the memory cell array 110 under control of the control logic 150. The peripheral circuit may drive the memory cell array 110 to perform the program operation, the read operation, and the erase operation.

The voltage generator 120 is configured to generate a plurality of operation voltages using an external power voltage supplied to the memory device 100. The voltage generator 120 operates in response to the control of the control logic 150.

As an embodiment, the voltage generator 120 may generate an internal power voltage by regulating the external power voltage. The internal power voltage generated by the voltage generator 120 is used as an operation voltage of the memory device 100.

As an embodiment, the voltage generator 120 may generate the plurality of operation voltages using an external power voltage or an internal power voltage. The voltage generator 120 may be configured to generate various voltages required in the memory device 100. For example, the voltage generator 120 may generate a plurality of erase voltages, a plurality of program voltages, a plurality of pass voltages, a plurality of selected read voltages, and a plurality of unselected read voltages.

The voltage generator 120 may include a plurality of pumping capacitors that receive the internal power voltage to generate the plurality of operation voltages having various voltage levels, and may generate the plurality of operation voltages by selectively activating the plurality of pumping capacitors in response to the control of the control logic 150.

The generated plurality of operation voltages may be supplied to the memory cell array 110 by the address decoder 130.

The address decoder 130 is connected to the memory cell array 110 through the row lines RL. The address decoder 130 is configured to operate in response to the control of the control logic 150. The address decoder 130 may receive an address ADDR from the control logic 150. The address decoder 130 may decode a block address among the received addresses ADDR. The address decoder 130 selects at least one memory block among the memory blocks BLK1 to BLKi according to the decoded block address. The address decoder 130 may decode a row address among the received addresses ADDR. The address decoder 130 may select at least one word line among word lines of a selected memory block according to the decoded row address. In an embodiment, the address decoder 130 may decode a column address among the received addresses ADDR. The address decoder 130 may connect the input/output circuit 140 and the memory cell array 110 to each other according to the decoded column address.

For example, the address decoder 130 may include components such as a row decoder, a column decoder, and an address buffer.

The input/output circuit 140 may include a plurality of page buffers. The plurality of page buffers may be connected to the memory cell array 110 through the bit lines. During the program operation, data may be stored in selected memory cells according to data stored in the plurality of page buffers.

During the read operation, the data stored in the selected memory cells may be sensed through the bit lines, and the sensed data may be stored in the page buffers.

The control logic 150 may control the address decoder 130, the voltage generator 120, and the input/output circuit 140. The control logic 150 may operate in response to the command CMD transmitted from an external device. The control logic 150 may generate control signals in response to the command CMD and the address ADDR to control the peripheral circuits. In an embodiment, the control logic 150 may include the refresh operation controller 160.

Figure 3:
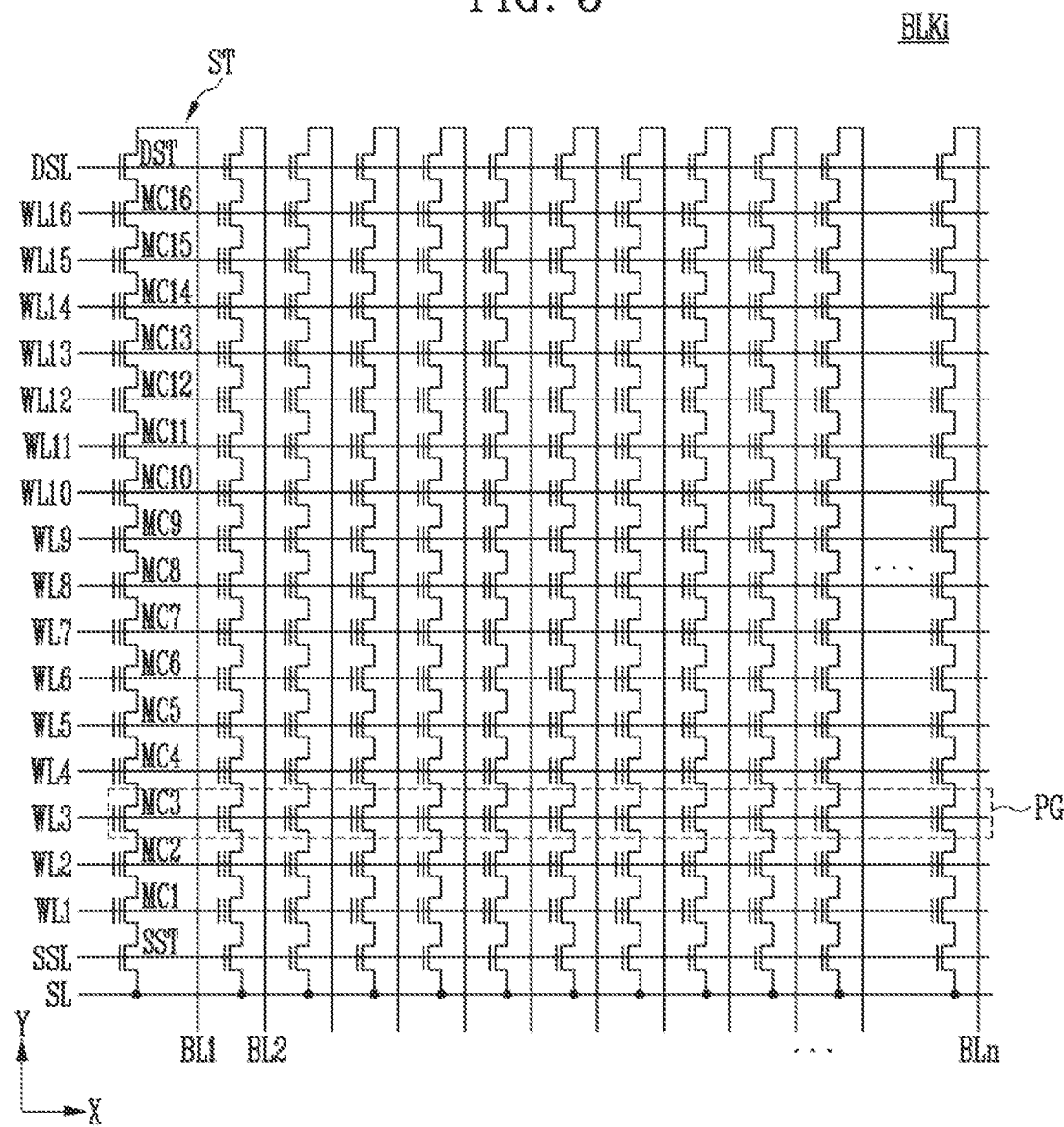
FIG. 3 is a diagram illustrating a structure of any one of memory blocks of FIG. 2.

FIG. 3 is a diagram illustrating a configuration of any one of the memory blocks of FIG. 2.

The memory block BLKi is any one memory block BLKi among the memory blocks BLK1 to BLKi of FIG. 2.

Referring to FIG. 3, a plurality of word lines arranged in parallel with each other may be connected between a first select line and a second select line. Here, the first select line may be the source select line SSL, and the second select line may be the drain select line DSL. More specifically, the memory block BLKi may include a plurality of strings ST connected between the bit lines BL1 to BLn and a source line SL. The bit lines BL1 to BLn may be connected to the strings ST, respectively, and the source line SL may be commonly connected to the strings ST. Since the strings ST may be configured to be identical to each other, a string ST connected to the first bit line BL1 is specifically described, as an example.

The string ST may include a source select transistor SST, a plurality of memory cells MC1 to MC16, and a drain select transistor DST connected in series between the source line SL and the first bit line BL1. One string ST may include at least one or more of the source select transistor SST and the drain select transistor DST, and may include the memory cells MC1 to MC16 more than the number shown in the figure.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKi may include the pages PG of the number of the word lines WL1 to WL16.

One memory cell may store one bit of data. This is commonly called a single level cell (SLC). In this case, one physical page PG may store one logical page (LPG) data. The one logical page (LPG) data may include data bits of the same number as cells included in one physical page PG.

The one memory cell may store two or more bits of data. In this case, one physical page PG may store two or more logical page (LPG) data.

Figure 4A:
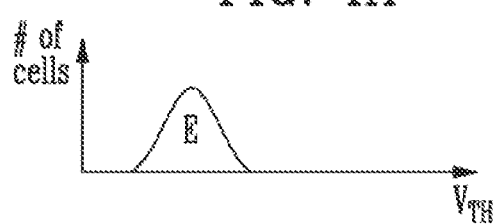
FIGS. 4A and 4B are diagrams illustrating a threshold voltage distribution of a single level cell.
Figure 4B:
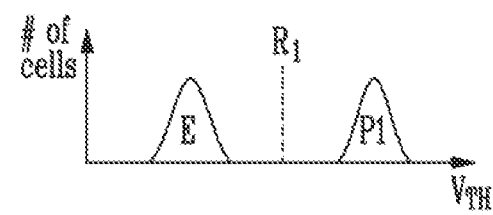

FIGS. 4A and 4B are diagrams illustrating a threshold voltage distribution of an SLC.

Referring to FIGS. 4A and 4B, a horizontal axis indicates a threshold voltage of a memory cell, and a vertical axis indicates the number of memory cells.

The memory device may perform the program operation in a word line unit. A plurality of memory cells connected to one word line may configure one physical page. The physical page may be a unit of the program operation or the read operation.

The memory device may perform the program operation to store data in memory cells connected to a selected word line among a plurality of word lines.

Selected memory cells, which are memory cells connected to the selected word line, may have a threshold voltage distribution corresponding to an erase state E as shown in FIG. 4A before the program operation is performed.

When the memory cell stores data corresponding to one bit, the memory cell may be programmed to have a threshold voltage corresponding to any one of the erase state E or a first program state P1.

The erase state E may correspond to data '1', and the first program state P1 may correspond to data '0'. However, the data corresponding to the first program state P1 is exemplary, and the erase state E may correspond to data '0', and the first program state P1 may correspond to data '1'.

When the program operation is ended, the selected memory cells may have the threshold voltage corresponding to any one of the erase state E or the first program state P1 as shown in FIG. 4B. The memory device may read data stored in the selected memory cells by performing a read operation using a first read voltage R1 between the erase state E and the first program state P1.

Figure 5A:
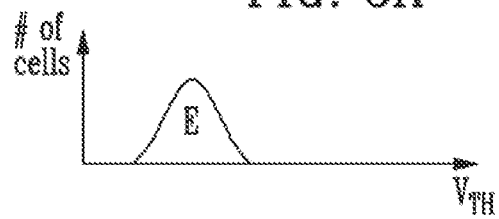
FIGS. 5A and 5B are diagrams illustrating a threshold voltage distribution of a multi-level cell.
Figure 5B:
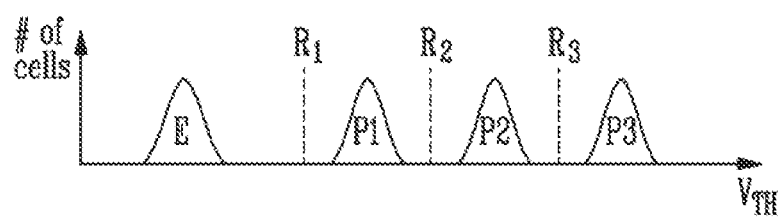

FIGS. 5A and 5B are diagrams illustrating a threshold voltage distribution of an MLC.

Referring to FIGS. 5A and 5B, a horizontal axis indicates a threshold voltage ($V_{TH}$) of a memory cell, and a vertical axis indicates the number of memory cells (# of cells).

Selected memory cells, which are memory cells connected to the selected word line, may have a threshold voltage distribution corresponding to an erase state E as shown in FIG. 5A before the program operation is performed.

When the memory cell stores data corresponding to two bits, the memory cell may be programmed to have a threshold voltage corresponding to any one of the erase state E, a first program state P1, a second program state P2, and a third program state P3.

The erase state E may correspond to data '11', the first program state P1 may correspond to data '10', the second program state P2 may correspond to data '00', and the third program state P3 may correspond to data '01'. However, the data corresponding to each program state is exemplary and may be variously modified.

When the program operation is ended, the selected memory cells may have the threshold voltage corresponding to any one of the erase state E, the first program state P1, the second program state P2, and the third program state P3 as shown in FIG. 5B. The memory device may read data stored in the selected memory cells by performing a read operation using first to third read voltages R1 to R3.

The first read voltage R1 may be a read voltage that distinguishes between the erase state E and the first program state P1, the second read voltage R2 may be a read voltage that distinguishes between the first program state P1 and the second program state P2, and the third read voltage R3 may be a read voltage that distinguishes between the second program state P2 and the third program state P3.

Figure 6A:
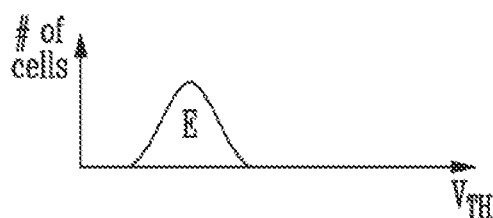
FIGS. 6A and 6B are diagrams illustrating a threshold voltage distribution of a triple level cell.
Figure 6B:
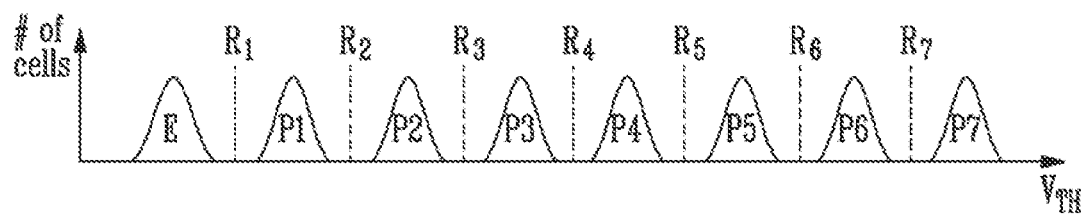

FIGS. 6A and 6B are diagrams illustrating a threshold voltage distribution of a TLC.

Referring to FIGS. 6A and 6B, a horizontal axis indicates a threshold voltage of a memory cell, and a vertical axis indicates the number of memory cells.

Selected memory cells, which are memory cells connected to the selected word line, may have a threshold voltage distribution corresponding to an erase state E as shown in FIG. 6A before the program operation is performed.

When the memory cell stores three bits of data, the memory cell may be programmed to have a threshold voltage corresponding to any one of the erase state E, a first program state P1, a second program state P2, a third program state P3, a fourth program state P4, a fifth program state P5, a sixth program state P6, and a seventh program state P7 as shown in FIG. 6B.

The erase state E may correspond to data '111', the first program state P1 may correspond to data '110', the second program state P2 may correspond to data '101', the third program state P3 may correspond to data '100', the fourth program state P4 may correspond to data '011', the fifth program state P5 may correspond to data '010', the sixth program state P6 may correspond to data '001', and the seventh program state P7 may correspond to data '000'. However, the data corresponding to each program state is exemplary and may be variously modified.

When the program operation is ended, the selected memory cells may have the threshold voltage corresponding to any one of the erase state E, the first program state P1, the second program state P2, the third program state P3, the fourth program state P4, the fifth program state P5, the sixth program state P6, and the seventh program state P7. The memory device may read data stored in the selected memory cells by performing a read operation using first to seventh read voltages R1 to R7 as shown in FIG. 6B.

The first read voltage R1 may be a read voltage that distinguishes between the erase state E and the first program state P1, the second read voltage R2 may be a read voltage that distinguishes between the first program state P1 and the second program state P2, the third read voltage R3 may be a read voltage that distinguishes between the second program state P2 and the third program state P3, the fourth read voltage R4 may be a read voltage that distinguishes between the third program state P3 and the fourth program state P4, the fifth read voltage R5 may be a read voltage that distinguishes between the fourth program state P4 and the fifth program state P5, the sixth read voltage R6 may be a read voltage that distinguishes between the fifth program state P5 and the sixth program state P6, and the seventh read voltage R7 may be a read voltage that distinguishes between the sixth program state P6 and the seventh program state P7.

Figure 7A:
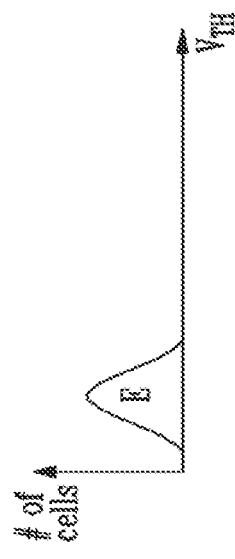
FIGS. 7A and 7B are diagrams illustrating a threshold voltage distribution of a quad level cell.
Figure 7B:
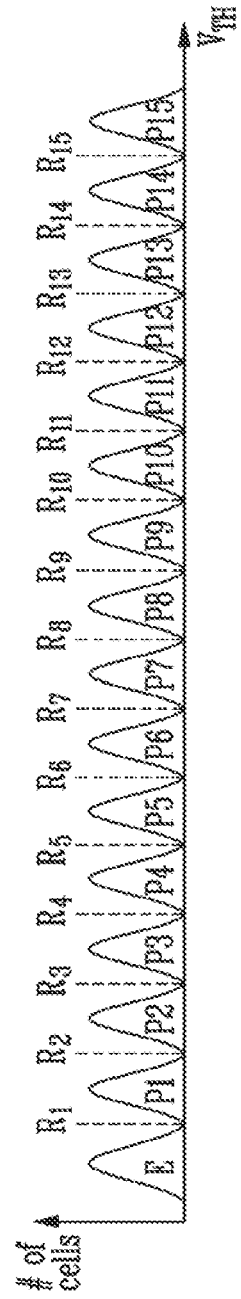

FIGS. 7A and 7B are diagrams illustrating a threshold voltage distribution of a QLC.

Referring to FIGS. 7A and 7B, a horizontal axis indicates a threshold voltage of a memory cell, and a vertical axis indicates the number of memory cells.

Selected memory cells, which are memory cells connected to the selected word line, may have a threshold voltage distribution corresponding to an erase state E as shown in FIG. 7A before the program operation is performed.

When the memory cell stores data corresponding to four bits, the memory cell may be programmed to have a threshold voltage corresponding to any one of the erase state E and first to fifteenth program states P1 to P15 as shown FIG. 7B.

The erase state E may correspond to data '1111', the first program state P1 may correspond to data '1110', the second program state P2 may correspond to data '1101', the third program state P3 may correspond to data '1100', the fourth program state P4 may correspond to data '1011', the fifth program state P5 may correspond to data '1010', the sixth program state P6 may correspond to data '1001', the seventh program state P7 may correspond to data '1000'. In addition, the eighth program state P8 may correspond to data '0111', the ninth program state P9 may correspond to data '0110', the tenth program state P10 may correspond to data '0101', the eleventh program state P11 may correspond to data '0100', the twelfth program state P12 may correspond to data '0011', the thirteenth program state P13 may correspond to data '0010', the fourteenth program state P14 may correspond to data '0001', and the fifteenth program state P15 may correspond to data '0000'. However, the data corresponding to each program state is exemplary and may be variously modified.

When the program operation is ended, the selected memory cells may have the threshold voltage corresponding to any one of the erase state E and the first to fifteenth program states P1 to P15 as shown FIG. 7B. The memory device may read data stored in the selected memory cells by performing a read operation using first to fifteenth read voltages R1 to R15.

The first read voltage R1 may be a read voltage that distinguishes between the erase state E and the first program state P1, the second read voltage R2 may be a read voltage that distinguishes between the first program state P1 and the second program state P2, the third read voltage R3 may be a read voltage that distinguishes between the second program state P2 and the third program state P3, the fourth read voltage R4 may be a read voltage that distinguishes between the third program state P3 and the fourth program state P4, the fifth read voltage R5 may be a read voltage that distinguishes between the fourth program state P4 and the fifth program state P5, the sixth read voltage R6 may be a read voltage that distinguishes between the fifth program state P5 and the sixth program state P6, the seventh read voltage R7 may be a read voltage that distinguishes between the sixth program state P6 and the seventh program state P7, the eighth read voltage R8 may be a read voltage that distinguishes between the seventh program state P7 and the eighth program state P8, the ninth read voltage R9 may be a read voltage that distinguishes between the eighth program state P8 and the ninth program state P9, the tenth read voltage R10 may be a read voltage that distinguishes between the ninth program state P9 and the tenth program state P10, the eleventh read voltage R11 may be a read voltage that distinguishes between the tenth program state P10 and the eleventh program state P11, the twelfth read voltage R12 may be a read voltage that distinguishes between the eleventh program state P11 and the twelfth program state P12, the thirteenth read voltage R13 may be a read voltage that distinguishes between the twelfth program state P12 and the thirteenth program state P13, the fourteenth read voltage R14 may be a read voltage that distinguishes between the thirteenth program state P13 and the fourteenth program state P14, and the fifteenth read voltage R15 may be a read voltage that distinguishes between the fourteenth program state P14 and the fifteenth program state P15.

FIG. 8 is a diagram illustrating a program operation.

In FIG. 8, for convenience of description, it is assumed that each of the plurality of memory cells is an MLC storing 2-bit data. However, the scope of the present disclosure is not limited thereto, and each of the plurality of memory cells may be a TLC storing 3-bit data or a QLC storing 4-bit data.

The program operation of the memory device 100 may include a plurality of program loops PL1 to PLn. That is, the memory device 100 may perform a program so that the selected memory cells have a threshold voltage corresponding to any one of a plurality of program states P1, P2, and P3 by performing the plurality of program loops PL1 to PLn.

Each of the plurality of program loops PL1 to PLn may include a program voltage apply step PGM Step of applying a program voltage and a verify step Verify Step of determining whether the memory cells are programmed by applying verify voltages.

For example, when the first program loop PL1 is performed, first to third verify voltages Vvfy1 to Vvfy3 are sequentially applied to verify the program states of the plurality of memory cells after a first program pulse Vpgm1 is applied. At this time, the memory cells in which a target program state is the first program state P1 may be verified by the first verify voltage Vvfy1, the memory cells in which a target program state is the second program state P2 may be verified by the second verify voltage Vvfy2, and the memory cells in which a target program state is the third program state P3 may be verified by the third verify voltage Vvfy3.

The memory cells of which the verification is passed by the verify voltages Vvfy1 to Vvfy3 may be determined to have the target program state, and then may be program-inhibited in the second program loop PL2. In the second program loop PL2, a second program pulse Vpgm2 higher than the first program pulse Vpgm1 by a unit voltage ΔVpgm is applied to program the remaining memory cells except for the program-inhibited memory cells. Thereafter, the verify operation is performed identically to the verify operation of the first program loop PL1. For example, the verify pass indicates that the memory cell is read as an off-cell by a corresponding verify voltage.

As described above, when the memory device 100 programs the MLC storing 2-bits, the memory device 100 verifies the memory cells in which each of program states has the target program state using the first to third verify voltages Vvfy1 to Vvfy3, respectively.

During the verify operation, the verify voltage may be applied to the selected word line, which is the word line to which the selected memory cells are connected, and the page buffer may determine whether the verification of the memory cells is passed based on a current or a voltage flowing through the bit lines respectively connected to the selected memory cells.

FIGS. 9A and 9B are diagrams illustrating a threshold voltage change of memory cells due to retention.

Hereinafter, for convenience of description, it is assumed that each of the memory cells included in the memory device 100 is programmed to a TLC capable of storing three bits of data. However, this is for convenience of description and does not limit the content of the present disclosure.

FIG. 9A illustrates a threshold voltage distribution, that is, an initial distribution, of the memory cells immediately after the program operation is completed.

As described with reference to FIG. 1, the memory controller 200 converts the write data into the program data. At this time, the data may be converted so that the number of memory cells to store each state is equal.

Assuming that the number of memory cells included in one page is 800, the number of memory cells respectively programmed to the erase state E and the first to seventh program states P1 to P7 may be 100.

After the program operation is completed, when the programmed memory cells are left for a predetermined time, a charge may be leaked from a charge trap layer of the memory cell to a channel region of the memory cell string. Accordingly, a phenomenon in which the threshold voltage of the memory cells is lower than that of the initial distribution of FIG. 9A may occur (retention). The word "predetermined" as used herein with respect to a parameter, such as a predetermined time, predetermined level, or predetermined sampling step voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

FIG. 9B illustrates a threshold voltage change of the memory cells left for a predetermined time after the program operation is completed. Referring to FIG. 9B, the threshold voltage of the memory cells respectively programmed to the erase state E and the first to seventh program states P1 to P7 generally decreases. A degree at which the threshold voltage decreases may be more severe in a higher program state. For example, a degree at which the threshold voltage of the memory cells of the fourth to seventh program states P4 to P7 decreases may be greater than a degree at which the threshold voltage of the memory cells of the first to third program states P1 to P3 decreases. This is because the higher the program state is, the more charges are included in the charge trap layer, and thus an amount of leaked charges is also greater.

Therefore, the memory cells of the seventh program state P7, which is the highest program state may be most affected by the retention phenomenon as described above. Therefore, in the initial distribution of FIG. 9A, the number of memory cells respectively programmed to the erase state E and the first to seventh program states P1 to P7 is 100, but after being left for a predetermined time (as shown in FIG. 9B), the threshold voltage of the memory cells of the seventh program state P7 may be decreased enough to have a threshold voltage lower than the seventh read voltage R7. Accordingly, the number of memory cells having a threshold voltage between the sixth read voltage R6 and the seventh read voltage R7 may increase, and the number of memory cells having a threshold voltage higher than the seventh read voltage R7 may decrease.

As the number of memory cells having the threshold voltage higher than the seventh read voltage R7 decreases more, the retention phenomenon occurs more severely. Therefore, the memory device 100 may determine whether to perform the refresh program operation based on the number of memory cells having the threshold voltage higher than the seventh read voltage R7.

For example, the memory device 100 may perform the read operation using the seventh read voltage R7 and count the number of off-cells having the threshold voltage higher than the seventh read voltage R7. Specifically, the memory device 100 may count the number of bits having a reference logic value (for example, "0") in data obtained by the read operation using the seventh read voltage R7. Here, the seventh read voltage R7 may be the test read voltage.

The memory device 100 may perform the read operation using the seventh read voltage R7 and determine whether the number of off cells having the threshold voltage higher than the seventh read voltage R7 is less than a first reference number. The first reference number may be a reference for determining whether to perform the refresh program operation. The first reference number may be a value determined by an experiment in a test process of the memory device 100.

Assuming that the first reference number is 80 in FIGS. 9A and 9B, since the number of memory cells having the threshold voltage higher than the seventh read voltage R7 is 79, performance of the refresh program operation may be triggered.

Figure 10:
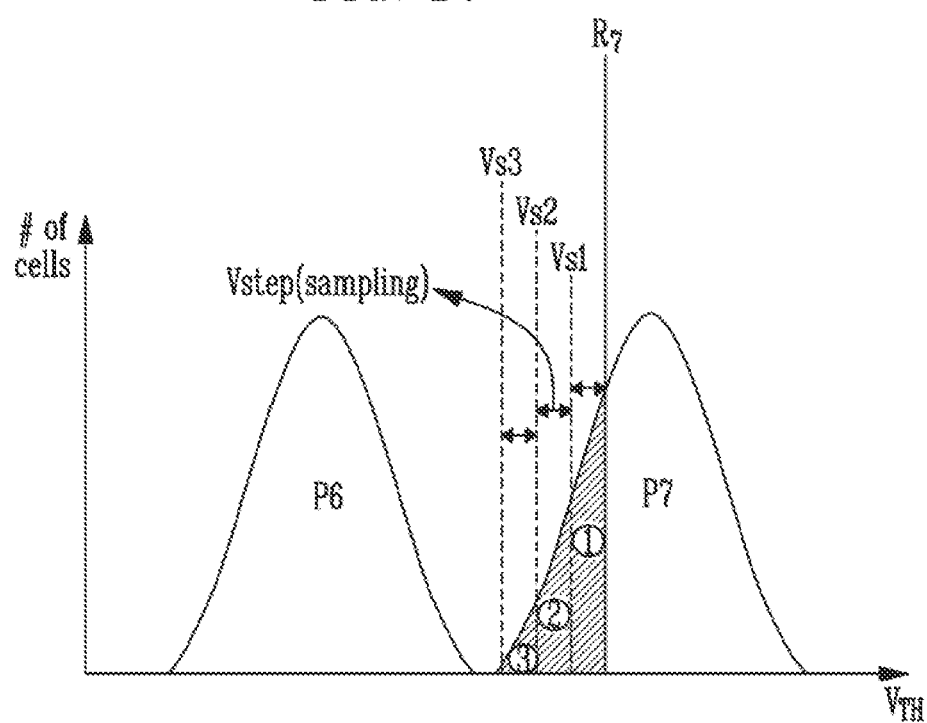
FIG. 10 is a diagram illustrating a sampling read operation.

FIG. 10 is a diagram illustrating a sampling read operation.

FIG. 11 is a diagram illustrating a method of generating refresh data using sampling read data.

Referring to FIGS. 10 and 11, FIG. 10 is a diagram illustrating only the threshold voltage distribution corresponding to the sixth program state P6 and the seventh program state P7 in the threshold voltage distribution shown in FIG. 9B.

Since the number of reference logic values (for example, "0") included in the data read with the seventh read voltage R7 is less than the first reference number (for example, 80), the memory device 100 may perform the refresh program operation. A target of the refresh program operation may be memory cells of which a threshold voltage is decreased by a predetermined level or more. The memory device 100 may perform at least one sampling read operation to determine the memory cells that become the target of the refresh program operation.

Specifically, memory cells included in a hatched region in FIG. 10 are memory cells of which a threshold voltage is required to be increased, that is, are targets of the refresh program operation. Data indicating the memory cells included in the hatched region may be refresh data.

The memory device 100 may first read the memory cells using a first sampling read voltage Vs1, which is a read voltage obtained by decreasing from the seventh read voltage R7 by a sampling step voltage Vstep(sampling).

The number of off-cells included in first sampling data Sampling DATA1, which is data read using the first sampling read voltage Vs1, may be the number of a sum of the number of off-cells sensed using the seventh read voltage R7, which is the test read voltage and the number of memory cells included in a first region ①.

The memory device 100 may determine whether the number of reference logical values (for example, "0") included in the first sampling data Sampling DATA1, which is the data read using the first sampling read voltage Vs1, exceeds a second reference number. Here, the second reference number may be the same as the first reference number for determining performance of the refresh program operation, or may be a value greater than the first reference number. In an embodiment, the second reference number may be greater than the first reference number, and may be less than a value obtained by dividing the number of memory cells included in one page by the number of states. In the embodiment of FIG. 10, it is assumed that the second reference number is 95.

When the number of reference logical values (for example, "0") included in the first sampling data Sampling DATA1 exceeds the second reference number, the memory device 100 may complete the sampling read operation and generate the refresh data using the sampling data and the test data.

FIG. 11 is a diagram illustrating data of some of memory cells included in a page shown by FIGS. 9A, 9B, and 10.

Referring to FIG. 11, in the test data read with the seventh read voltage R7, a first memory cell MC1, a third memory cell MC3, a sixth memory cell MC6, a seventh memory cell MC7, and a ninth memory cell MC9 may be read as off-cells "0", and a second memory cell MC2, a fourth memory cell MC4, a fifth memory cell MC5, and an eighth memory cell MC8 may be read as on-cells "1".

Referring to the first sampling data Sampling DATA1 read with the first sampling read voltage Vs1, the fourth memory cell MC4 read as the on-cell "1" in the test data may be read as the off-cell "0". Therefore, a threshold voltage of the fourth memory cell MC4 may be included in the first region ① of FIG. 10.

Assuming that the number of reference logic values (for example, "0") included in the first sampling data Sampling DATA1 is equal to or less than the second reference number, the memory device 100 may perform an additional sampling read operation using a second sampling read voltage Vs2.

The second sampling read voltage Vs2 may be a read voltage smaller than the first sampling read voltage Vs1 by the sampling step voltage Vstep(sampling).

The number of off-cells included in the second sampling data Sampling DATA2, which is data read using the second sampling read voltage Vs2, may be the number of a sum of the number of off-cells sensed using the seventh read voltage R7, which is the test read voltage, the number of memory cells included in the first region ① and the number of memory cells included in a second region ②.

The memory device 100 may determine whether the number of reference logical values (for example, "0") included in the second sampling data Sampling DATA2, which is the data read using the second sampling read voltage Vs2 exceeds the second reference number.

The fifth memory cell MC5 and the eighth memory cell MC8, which are read as the on-cell ("1") in the test data and the first sampling data Sampling DATA1, are read as the off-cell ("0") in the second sampling data Sampling DATA2, the fifth memory cell MC5 and the eighth memory cell MC8 may be included in the second region ② of FIG. 10.

Assuming that the number of reference logical values (for example, "0") included in the second sampling data Sampling DATA2 is equal to or less than the second reference number, the memory device 100 may perform an additional sampling read operation using a third sampling read voltage Vs3.

The third sampling read voltage Vs3 may be a read voltage smaller than the second sampling read voltage Vs2 by the sampling step voltage Vstep(sampling).

The number of off-cells included in third sampling data Sampling DATA3, which is data read using the third sampling read voltage Vs3, is the number of a sum of the number of off-cells sensed using the seventh read voltage R7, which is the test read voltage, the number of memory cells included in the first region ①, the number of memory cells included in the second region ②, and the number of memory cells included in a third region ③.

The second memory cell MC2, which is read as the on-cell ("1") in the test data, the first sampling data Sampling DATA1, and the second sampling data Sampling DATA2, is read as the off-cell ("0") in the third sampling data Sampling DATA3, the second memory cell MC2 may be included in the third region ③ of FIG. 10.

Assuming that the number of reference logic values (for example, "0") included in the third sampling data Sampling DATA3, which is the data read using the third sampling read voltage Vs3, exceeds the second reference number, the memory device 100 may generate refresh data, which is data indicating memory cells on which the refresh program operation is to be performed, using the sampling data and the test data.

The memory cells on which the refresh program operation is to be performed may be the memory cells read as the on-cells ("1") in the test read operation and then read as the off-cells ("0") in the sampling read operation. That is, the memory cells on which the refresh program operation is to be performed may be memory cells in which a value of the test data and a value of the sampling data are changed.

The memory device 100 may generate the refresh data Refresh DATA by performing an exclusive OR (XOR) operation on the test data and the sampling data. When the sampling read operation is performed two or more times, the memory device 100 may generate the refresh data Refresh DATA by accumulatively performing an XOR operation on the test data and a plurality of sampling data.

In FIG. 11, when accumulatively performing an XOR operation on the test data Test DATA and the first to third sampling data Sampling DATA1 to DATA3, target cells of the refresh program operation may be indicated by a logical value "1", and cells which are not the target of the refresh program operation may be indicated by a logical value of "0".

Alternatively, in various embodiments, when the sampling read operation is performed two or more times, the memory device 100 may generate the refresh data Refresh DATA by performing an XOR operation on the test data and the last performed sampling data.

In FIG. 11, when the XOR operation is performed on the test data Test DATA and the third sampling data Sampling DATA3, target cells of the refresh program operation may be indicated by a logical value "1", and cells which are not the target of the refresh program operation may be indicated by a logical value of "0".

Figure 12:
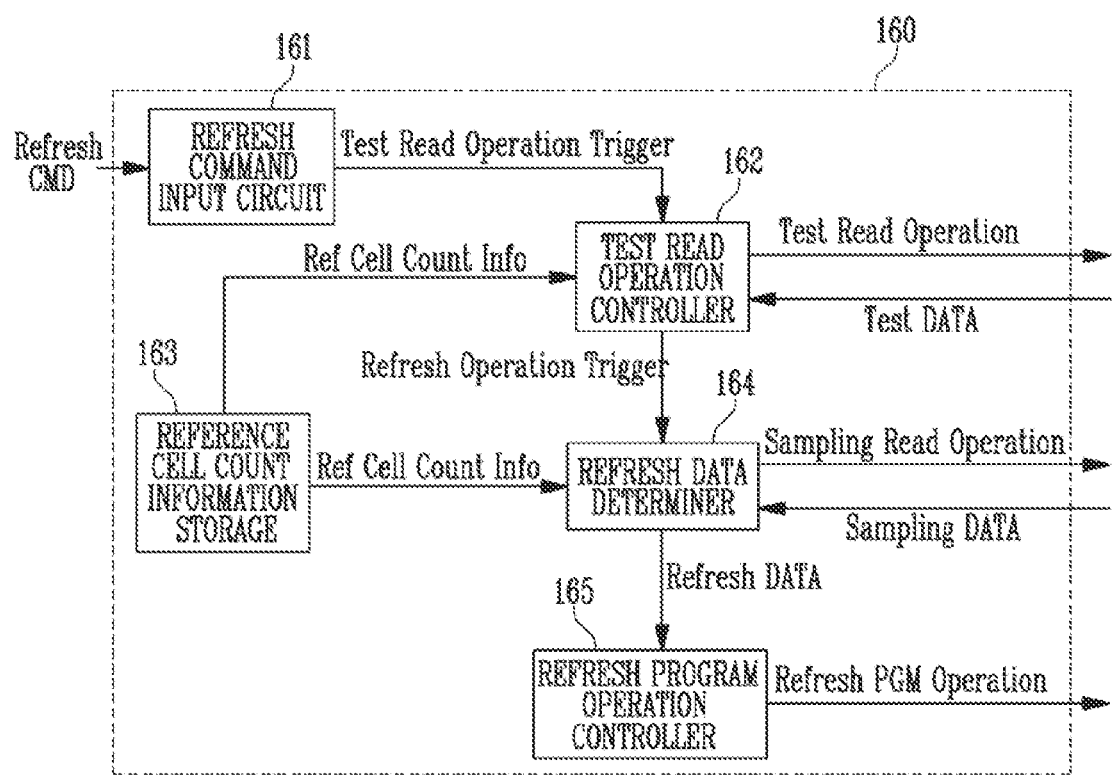
FIG. 12 is a diagram illustrating a structure of a refresh operation controller of FIG. 1.

FIG. 12 is a diagram illustrating a structure of the refresh operation controller of FIG. 1.

Referring to FIG. 12, the refresh operation controller 160 may include a refresh command input circuit 161, a test read operation controller 162, a reference cell count information storage 163, a refresh data determiner 164, and a refresh program operation controller 165.

The refresh command input circuit 161 may receive a refresh command Refresh CMD. The refresh command Refresh CMD may be provided from the memory controller 200 described with reference to FIG. 1.

The refresh command input circuit 161 may generate a test read operation start signal Test Read Operation Trigger instructing to start the test read operation in response to the refresh command Refresh CMD. The generated test read operation start signal Test Read Operation Trigger may be provided to the test read operation controller 162.

The test read operation controller 162 may perform the test read operation in response to the test read operation start signal Test Read Operation Trigger, and output a refresh operation start signal Refresh Operation Trigger instructing to perform the refresh operation based on a performance result of the test read operation.

Specifically, the test read operation controller 162 may perform the test read operation of reading the memory cells included in the page corresponding to the refresh address using the test read voltage by controlling the voltage generator 120, the address decoder 130, and the input/output circuit 140 described with reference to FIG. 2. According to the test read operation, the test data Test DATA, which is the data obtained by reading the memory cells, may be stored in the page buffers included in the input/output circuit 140. The test read operation controller 162 may obtain the test data Test DATA from the page buffers.

The test read voltage may be some read voltage among the basically set default read voltages of the memory device 100. The test read voltage may be a read voltage for distinguishing between the highest program state and the program state adjacent to the highest program state among the plurality of default read voltages. For example, in a case of the TLC, the seventh read voltage R7 may be the test read voltage, and in a case of the QLC, the fifteenth read voltage R15 may be the test read voltage.

The test read operation controller 162 may compare the reference number with the number of reference logical values (for example, "0") included in the test data Test DATA based on reference cell count information Ref cell Count Info stored in the reference cell count information storage 163. Specifically, the reference number compared with the number of reference logical values (for example, "0") included in the test data Test DATA may be the first reference number. The first reference number may be a value less than a value obtained by dividing the number of memory cells configuring one page by the number of states of the memory cells after the program operation is completed.

When the number of reference logical values (for example, "0") included in the test data Test DATA is less than the first reference number, the test read operation controller 162 may output the refresh operation start signal Refresh Operation Trigger, and when the number of reference logic values (for example, "0") included in the test data Test DATA is equal to or greater than the first reference number, the test read operation controller 162 might not output the refresh operation start signal Refresh Operation Trigger.

The reference cell count information storage 163 may store the reference cell count information Ref cell count info. The reference cell count information Ref cell count info may include the first reference number compared with the number of reference logical values (for example, "0") included in the test data Test DATA and the second reference number compared with the number of reference logical values (for example, "0") included in the sampling data Sampling DATA.

In an embodiment, the first reference number may be less than a value obtained by dividing the number of memory cells configuring one page by the number of states of the memory cells after the program operation is completed. The second reference number may be a value greater than the first reference number. The second reference number may be greater than the first reference number, and may be less than the value obtained by dividing the number of memory cells configuring one page by the number of states of the memory cells after the program operation is completed. In various embodiments, the first reference number and the second reference number may be the same. Alternatively, the first reference number and the second reference number may be the same as the value obtained by dividing the number of memory cells configuring one page by the number of states of the memory cells after the program operation is completed.

The refresh data determiner 164 may determine the refresh data Refresh DATA in response to the refresh operation start signal Refresh Operation Trigger. The refresh data Refresh DATA may be data identifying the memory cells on which the refresh program operation is to be performed. That is, the refresh data Refresh DATA may be data identifying the memory cells of which the threshold voltage is decreased by a predetermined level or more due to the retention. Specifically, the refresh data Refresh DATA may be data indicating the memory cells that are read as the on-cell in the test read operation and then read as the off-cell in the sampling read operation.

The refresh data determiner 164 may control the voltage generator 120, the address decoder 130, and the input/output circuit 140 to perform the sampling read operation Sampling Read Operation. The sampling read operation Sampling Read Operation may be an operation of reading the memory cells included in the page corresponding to the refresh address using the sampling read voltage. The sampling read voltage may be a voltage lower than the test read voltage by a predetermined sampling step voltage. The refresh data determiner 164 may obtain the sampling data Sampling DATA, which is a performance result of the sampling read operation Sampling Read Operation.

The refresh data determiner 164 may determine whether to end the sampling read operation or perform the additional sampling read operation using the reference cell count information Ref cell Count Info. When the number of reference logical values (for example, "0") included in the sampling data Sampling DATA exceeds the second reference number, the refresh data determiner 164 may end the sampling read operation Sampling Read Operation, and generate the refresh data Refresh DATA. When the number of reference logical values (for example, "0") included in the sampling data Sampling DATA is equal to or less than the second reference number, the refresh data determiner 164 may additionally perform the sampling read operation Sampling Read Operation. At this time, the applied additional sampling read voltage may be a voltage lower than a previously applied sampling read voltage by the sampling step voltage. The refresh data determiner 164 may repeatedly perform the sampling read operation Sampling Read Operation while decreasing the sampling read voltage by the sampling step voltage until the number of reference logic values (for example, "O") included in the sampling data Sampling DATA exceeds the second reference number.

When the number of reference logical values (for example, "0") included in the sampling data Sampling DATA exceeds the second reference number, the refresh data determiner 164 may generate the refresh data Refresh DATA by performing an XOR operation on the test data Test DATA and the sampling data Sampling DATA. When the sampling read operation Sampling Read Operation is performed two or more times, the refresh data Refresh DATA may be obtained by performing an XOR operation accumulatively the obtained sampling data Sampling DATA or performing an XOR operation on the last obtained sampling data Sampling DATA and the test data Test DATA.

The refresh data determiner 164 may provide the determined refresh data Refresh DATA to the refresh program operation controller 165.

The refresh program operation controller 165 may control the voltage generator 120, the address decoder 130, and the input/output circuit 140 to perform the refresh program operation Refresh PGM Operation. During the refresh program operation Refresh PGM Operation, the refresh program voltage may be applied to the memory cells selected by the refresh address. The refresh program voltage may be a program voltage corresponding to the highest program state among the plurality of program states. Alternatively, the refresh program voltage may be a voltage greater than the program voltage corresponding to the highest program state by a magnitude of the sampling step voltage. In determining the refresh data Refresh DATA, when two or more sampling read operations Sampling Read Operation are performed, the refresh program voltage may be a voltage greater than the program voltage corresponding to the highest program state by a voltage of a magnitude obtained by multiplying the number of times the sampling read operations Sampling Read Operation are performed and the sampling step voltage.

While the refresh program voltage is applied, the program permission voltage may be applied to the bit lines to which the memory cells that become the target of the refresh program operation are connected according to the refresh data Refresh DATA, and the program inhibition voltage may be applied to the bit lines to which the remaining memory cells are connected.

The refresh program operation Refresh PGM Operation may include a verify operation corresponding to the highest program state.

Figure 13:
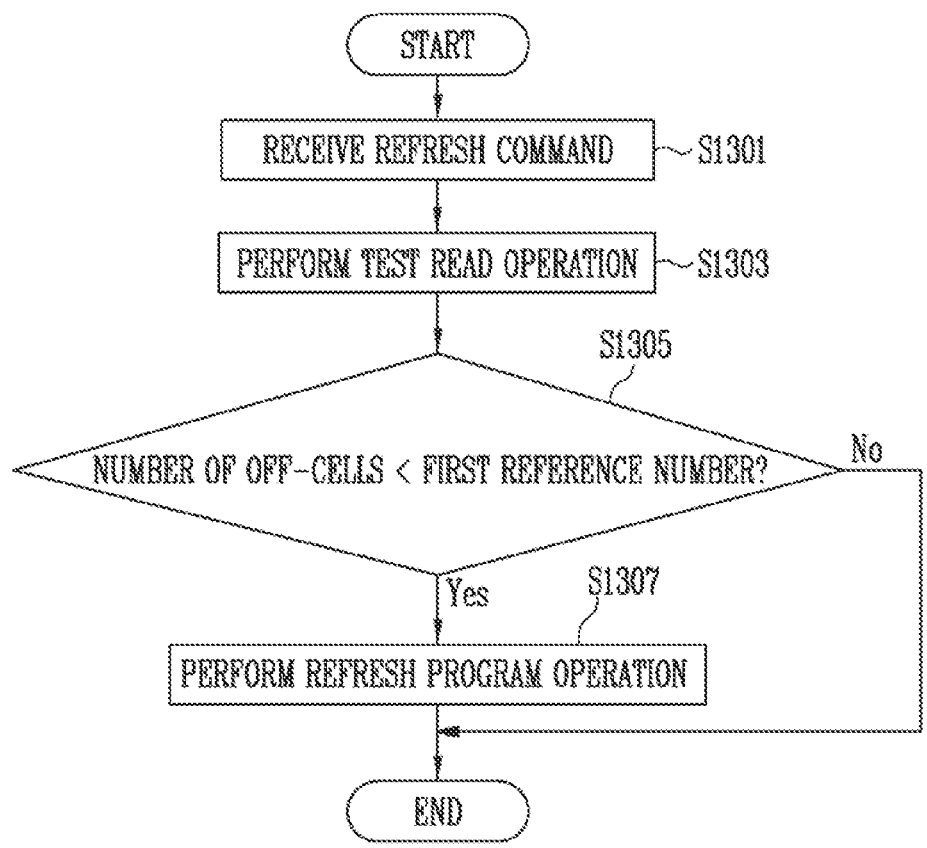
FIG. 13 is a flowchart illustrating a method of operating a memory device according to an embodiment of the present disclosure.

FIG. 13 is a flowchart illustrating a method of operating a memory device according to an embodiment of the present disclosure.

Referring to FIG. 13, in step S1301, the memory device may receive the refresh command from the memory controller.

In step S1303, the memory device may perform the test read operation. The test read operation may be the read operation using the test read voltage. The test read voltage may be some read voltages of the default read voltages.

In step S1305, the memory device may determine whether the number of memory cells read as the off-cell by the test read operation is less than the first reference number. When the number of memory cells read as the off-cell by the test read operation is less than the first reference number, the operation may proceed to step S1307 to perform the refresh program operation, and when the number of memory cells read as the off-cell by the test read operation is equal to or greater than the first reference number, the operation may be ended.

Figures 14, 15:
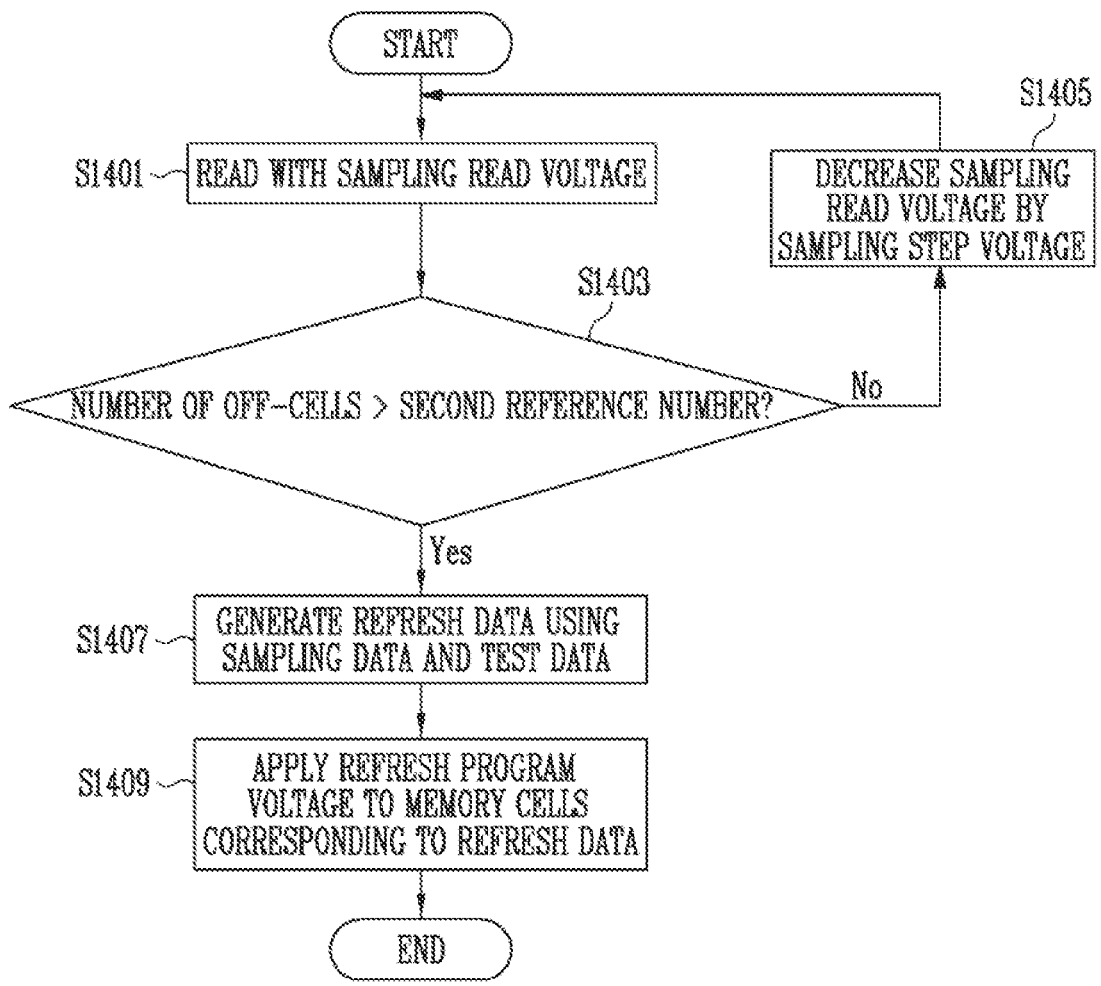
FIG. 14 is a flowchart illustrating a method of operating a memory device according to an embodiment of the present disclosure.
FIG. 15 is a diagram illustrating a method of determining a program state on which a refresh program operation is to be performed according to an embodiment of the present disclosure.

FIG. 14 is a flowchart illustrating a method of operating a memory device according to an embodiment of the present disclosure.

The operations shown in FIG. 14 describe the refresh program operation of step S1307 described with reference to FIG. 13 in more detail.

In step S1401, the memory device may read the memory cells using the sampling read voltage. The sampling read voltage may be the voltage lower than the test read voltage by the predetermined sampling step voltage.

In step S1403, the memory device may determine whether the number of memory cells read as the off-cell exceeds the second reference number as a result of reading using the sampling read voltage. When the number of memory cells read as the off-cell exceeds the second reference number as the result of reading using the sampling read voltage, the operation proceeds to step S1407, and when the number of memory cells read as the off-cell does not exceed the second reference number as the result of reading using the sampling read voltage, the operation proceeds to step S1405.

In step S1405, the memory device may decrease the sampling read voltage by the sampling step voltage. Thereafter, the memory device may return to step S1401 and perform the read operation again using the changed sampling read voltage.

In step S1407, the memory device may generate the refresh data using the sampling data and the test data. Specifically, the refresh data may be the data obtained by performing an XOR operation on the sampling data and the test data. When step S1401 is performed two or more times, the refresh data may be data obtained by performing an XOR operation on all sampling data and the test data. Alternatively, the refresh data may be data obtained by performing an XOR operation on the test data and the sampling data by the last performed sampling read operation.

In step S1409, the memory device may apply the refresh program voltage to the memory cells on which the refresh program operation is to be performed according to the refresh data.

In the present specification, for convenience of description, the refresh program operation is performed only on the memory cells corresponding to the highest program state, but according to an embodiment of the present disclosure, the refresh program operation may be performed on the plurality of program states. In this case, the refresh data corresponding to each program state may be generated according to the method described with reference to FIGS. 9A to 11, and the refresh program operation may be performed using the generated refresh data.

FIG. 15 is a diagram illustrating a method of determining a program state on which a refresh program operation is to be performed according to an embodiment of the present disclosure.

In the embodiment of FIG. 15, it is assumed that the memory cells are programmed to the MLC storing two bits of data for each one memory cell. The number of target program states which are program states on which the refresh program operation is to be performed may be plural. That is, the refresh program operation may be performed also with respect to the program state except for the highest program state.

The memory device may determine the target program state on which the test read operation is to be performed according to a length of the retention time tret, which is a time left from a time when the program operation of storing data in the memory cells is completed to a time when the refresh command is input.

As described with reference to FIG. 9A and FIG. 9B, an amount of decrease of the threshold voltage may be greater as the retention phenomenon of the program state is higher. In addition, as the retention time tret, which is the left time increases, the amount of decrease of the threshold voltage may further increase. Therefore, when the retention time tret is very long, occurrence of a read fail might not be prevented with performing the refresh program operation only with respect to the highest program state.

Therefore, the memory device according to an embodiment of the present disclosure may increase the number of program states on which the refresh program operation is to be performed as the retention time tret increases. As the retention time tret increases, the memory device may include the program states on which the refresh program operation is to be performed in an order from a program state corresponding to a relatively high threshold voltage to a program state corresponding to a relatively low threshold voltage.

For example, when the retention time tret is equal to or less than tm1, the memory device might not perform the test read operation. When the retention time tret exceeds tm1 and is equal to or less than tm2, the memory device may perform the test read operation for determining whether to perform the refresh program operation with respect to the third program state P3. When the retention time tret exceeds tm2 and is less than tm3, the memory device may perform the test read operation to determine whether to perform the refresh program operation with respect to the second program state P2 and the third program state P3. That is, the memory device may perform steps S1303 to S1307 with respect to the third program state P3, which is the highest program state. Thereafter, steps S1303 to S1307 may be performed with respect to the second program state P2. In an embodiment, the memory device may generate the refresh data with respect to each of the second program state P2 and the third program state P3, and then simultaneously perform an operation of applying the refresh program voltage. When the retention time tret exceeds tm3, the memory device may perform the test read operation for determining whether to perform the refresh program operation with respect to each of the first to third program states P1 to P3. In an embodiment tm1, tm2, and tm3 represent durations of time for the retention time tret whereby time durations tm1, tm2, and tm3 are natural numbers greater than zero, and tm1 is less than tm2 and tm2 is less than tm3.

FIG. 16 is a diagram illustrating a method of determining a program state on which a refresh program operation is to be performed according to an embodiment of the present disclosure.

In the embodiment of FIG. 16, it is assumed that the memory cells are programmed to the TLC storing three bits of data for each one memory cell.

The memory device according to an embodiment of the present disclosure may increase the number of program states on which the refresh program operation is to be performed as the retention time tret increases. As the retention time tret increases, the memory device may include the program states on which the refresh program operation is to be performed in an order from a program state corresponding to a relatively high threshold voltage to a program state corresponding to a relatively low threshold voltage.

When the retention time tret is equal to or less than tc1, the memory device might not perform the test read operation. When the retention time tret exceeds tc1 and is equal to or less than tc2, the memory device may perform the test read operation for determining whether to perform the refresh program operation with respect to the seventh program state P7. When the retention time tret exceeds tc2 and is less than tc3, the memory device may perform the test read operation to determine whether to perform the refresh program operation with respect to the sixth program state P6 and the seventh program state P7.

In an embodiment, the memory device may generate refresh data of each of the sixth program state P6 and the seventh program state P7, and then simultaneously perform an operation of applying the refresh program voltage. According to the method described above, the memory device may determine the first to seventh program states P1 to P7 as the target on which the refresh program operation is to be performed sequentially from the seventh program state P7 to the first program state P1 according to which period of FIG. 16 the retention time tret is included. In an embodiment tc1, tc2, tc3, tc4, tc5, tc6, and tc7 represent durations of time for the retention time tret whereby time durations tc1, tc2, tc3, tc4, tc5, tc6, and tc7 are natural numbers greater than zero, and tc1 is less than tc2, tc2 is less than tc3, tc3 is less than tc4, tc4 is less than tc5, tc5 is less than tc6, and tc6 is less than tc7.

FIG. 17 is a diagram illustrating a method of determining a program state on which a refresh program operation is to be performed according to an embodiment of the present disclosure.

In the embodiment of FIG. 17, it is assumed that the memory cells are programmed to the QLC storing four bits of data for each one memory cell.

The memory device according to an embodiment of the present disclosure may increase the number of program states on which the refresh program operation is to be performed as the retention time tret increases. As the retention time tret increases, the memory device may include the program states on which the refresh program operation is to be performed in an order from a program state corresponding to a relatively high threshold voltage to a program state corresponding to a relatively low threshold voltage.

When the retention time tret is equal to or less than tq1, the memory device might not perform the test read operation. When the retention time tret exceeds tq1 and is equal to or less than tq2, the memory device may perform the test read operation for determining whether to perform the refresh program operation with respect to the fifteenth program state P15. When the retention time tret exceeds tq2 and is less than tq3, the memory device may perform the test read operation to determine whether to perform the refresh program operation with respect to the fourteenth program state P14 and the fifteenth program state P15.

In an embodiment, the memory device may generate refresh data of each of the fourteenth program state P14 and the fifteenth program state P15, and then simultaneously perform an operation of applying the refresh program voltage. According to the method described above, the memory device may determine the first to fifteenth program states P1 to P15 as the target on which the refresh program operation is to be performed sequentially from the fifteenth program state P15 to the first program state P1 according to which period of FIG. 17 the retention time tret is included. In an embodiment tq1, tq2, tq3, tq4, tq5, tq6, tq7, tq8, tq9, tq10, tq11, tq12, tq13, tq14, and tq15 represent durations of time for the retention time tret whereby time durations tq1, tq2, tq3, tq4, tq5, tq6, tq7, tq8, tq9, tq10, tq11, tq12, tq13, tq14, and tq15 are natural numbers greater than zero, and tq1 is less than tq2, tq2 is less than tq3, tq3 is less than tq4, tq4 is less than tq5, tq5 is less than tq6, tq6 is less than tq7, tq7 is less than tq8, tq8 is less than tq9, tq9 is less than tq10, tq10 is less than tq11, tq11 is less than tq12, tq12 is less than tq13, tq13 is less than tq14, tq14 is less than tq15.

Figure 18:
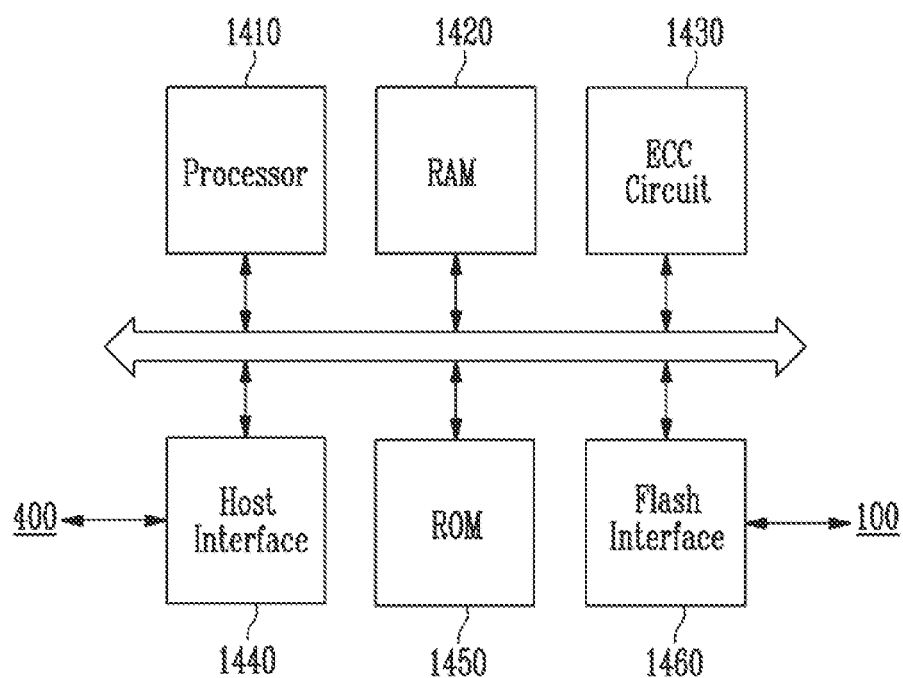
FIG. 18 is a diagram illustrating another embodiment of a memory controller of FIG. 1.

FIG. 18 is a diagram illustrating another embodiment of the memory controller of FIG. 1.

Referring to FIG. 18, the memory controller 1400 may include a processor 1410, a RAM 1420, an ECC circuit 1430, a host interface 1440, a ROM 1450, and a flash interface 1460.

The processor 1410 may control an overall operation of the memory controller 1400. The RAM 1420 may be used as a buffer memory, a cache memory, an operation memory, and the like of the memory controller 1400.

The ROM 1450 may store various pieces of information required for the memory controller 1400 to operate in a firmware form.

The memory controller 1400 may communicate with an external device (for example, the host 400, an application processor, and the like) through the host interface 1440.

The memory controller 1400 may communicate with the memory device 100 through the flash interface 1460. The memory controller 1400 may transmit a command CMD, an address ADDR, a control signal CTRL, and the like to the memory device 100 and receive data DATA through the flash interface 1460. For example, the flash interface 1460 may include a NAND interface.

Figure 19:
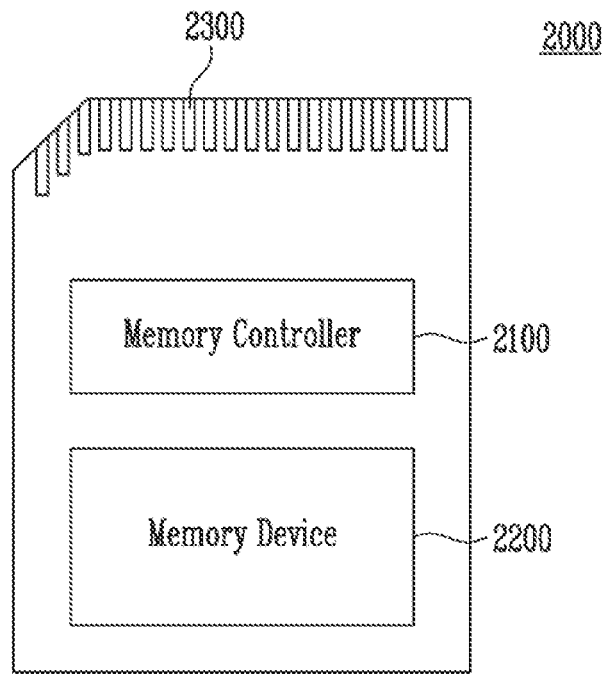
FIG. 19 is a block diagram illustrating a memory card system to which a storage device according to an embodiment of the present disclosure is applied.

FIG. 19 is a block diagram illustrating a memory card system to which a storage device according to an embodiment of the present disclosure is applied.

Referring to FIG. 19, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, program, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 20:
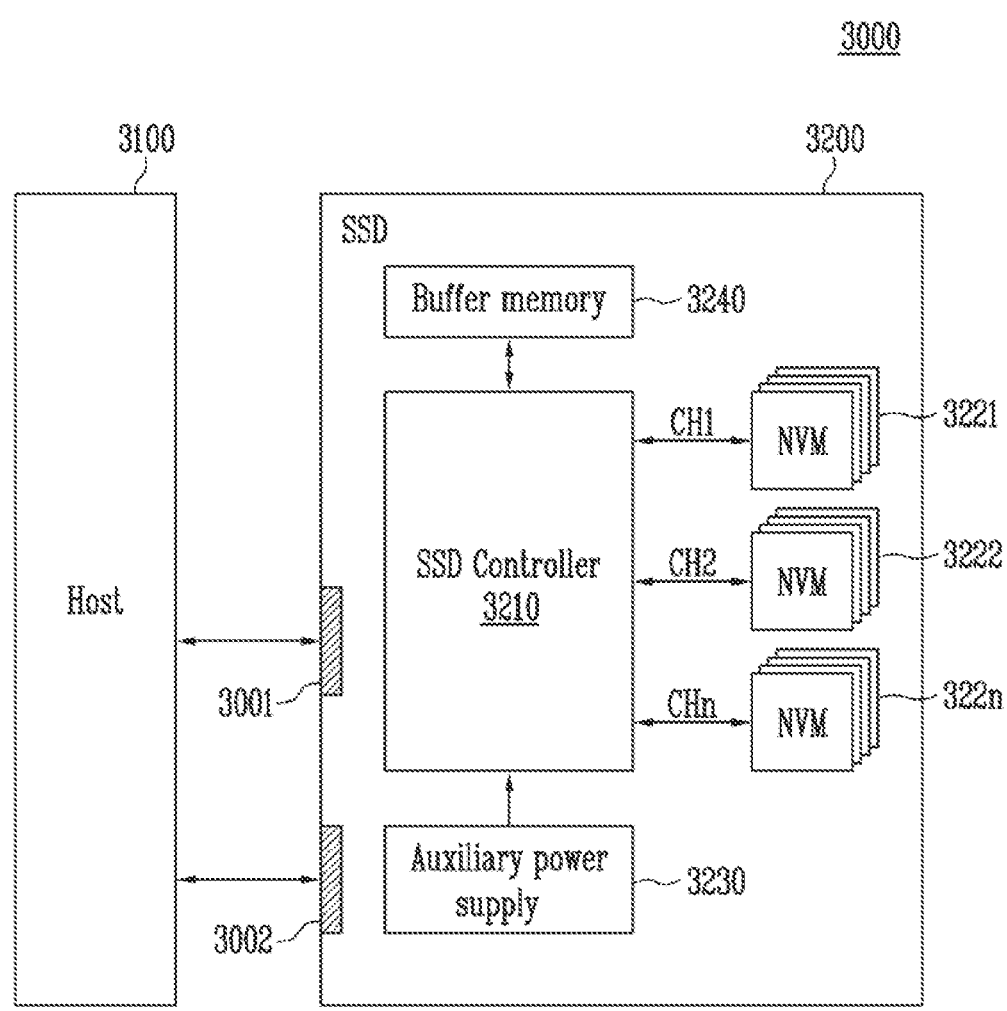
FIG. 20 is a block diagram illustrating a solid state drive (SSD) system to which a storage device according to an embodiment of the present disclosure is applied.

FIG. 20 is a block diagram illustrating a solid state drive (SSD) system to which a storage device according to an embodiment of the present disclosure is applied.

Referring to FIG. 20, the SSD system 3000 includes a host 3100 and an SSD 3200. The SSD 3200 exchanges a signal with the host 3100 through a signal connector 3001 and receives power through a power connector 3002. The SSD 3200 includes an SSD controller 3210, a plurality of flash memories 3221 to 322n, an auxiliary power supply 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal received from the host 3100. For example, the signal may be signals based on an interface between the host 3100 and the SSD 3200. For example, the signal may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power supply 3230 is connected to the host 3100 through the power connector 3002. The auxiliary power supply 3230 may receive the power from the host 3100 and may charge the power. The auxiliary power supply 3230 may provide power of the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 21:
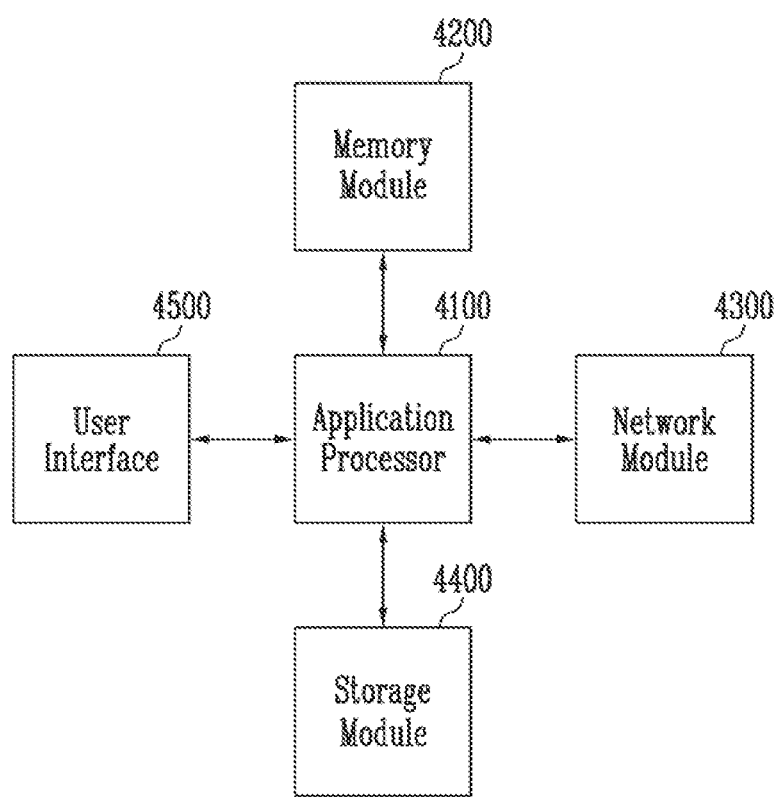
FIG. 21 is a block diagram illustrating a user system to which a storage device according to an embodiment of the present disclosure is applied.

FIG. 21 is a block diagram illustrating a user system to which a storage device according to an embodiment of the present disclosure is applied.

Referring to FIG. 21, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
    memory cells configured to be programmed so that each of the memory cells has a threshold voltage corresponding to any one of a plurality of program states;
    a peripheral circuit configured to perform a read operation or a program operation on the memory cells; and
    control logic configured to control the peripheral circuit to perform a test read operation of reading the memory cells using a test read voltage that is any one read voltage among preset default read voltages, and perform a refresh program operation of applying a refresh program voltage to some memory cells among the memory cells according to the number of memory cells having a threshold voltage greater than the test read voltage.

2. The memory device of claim 1, wherein the control logic comprises:
    a refresh command input circuit configured to generate a test read operation start signal in response to a refresh command input from outside the memory device;
    a reference cell count information storage configured to store information on a first reference number for determining whether to perform the refresh program operation and a second reference number for determining target cells for the refresh program operation; and
    a test read operation controller configured to apply the test read voltage to the memory cells in response to the test read operation start signal, obtain test data, which is data obtained by sensing the memory cells with the test read voltage, and generate a refresh operation start signal according to whether the number of reference logic values included in the test data is less than the first reference number.

3. The memory device of claim 1, wherein the test read voltage is a read voltage for distinguishing a program state having a highest threshold voltage distribution among the plurality of program states.

4. The memory device of claim 2, wherein the test read operation controller generates the refresh operation start signal when the number of the reference logic values included in the test data is less than the first reference number.

5. The memory device of claim 2, wherein the first reference number is a value less than a value obtained by dividing the number of the memory cells by the number of the plurality of program states.

6. The memory device of claim 2, wherein the control logic further comprises:
    a refresh data determiner configured to perform a sampling read operation of reading the memory cells using a sampling read voltage in response to the refresh operation start signal, obtain sampling data, which is data obtained by sensing the memory cells with the sampling read voltage, and determine refresh data indicating the some memory cells according to whether the number of the reference logic values included in the sampling data exceeds the second reference number; and
    a refresh program operation controller configured to perform the refresh program operation on the some memory cells.

7. The memory device of claim 6, wherein the sampling read voltage is a voltage smaller than the test read voltage by a sampling step voltage.

8. The memory device of claim 6, wherein when the number of the reference logic values included in the sampling data is equal to or less than the second reference number, the refresh data determiner performs an additional sampling operation of reading the memory cells with an additional sampling read voltage obtained by decreasing the sampling read voltage by a sampling step voltage.

9. The memory device of claim 6, wherein when the number of the reference logic values included in the sampling data exceeds the second reference number, the refresh data determiner determines the refresh data by comparing the test data with the sampling data.

10. The memory device of claim 6, wherein when the number of the reference logical values included in the sampling data exceeds the second reference number, the refresh data determiner determines data obtained by performing an exclusive OR (XOR) operation on the test data and the sampling data as the refresh data.

11. The memory device of claim 8, wherein the refresh data determiner obtains additional sampling data, which is data obtained by sensing the memory cells with the additional sampling read voltage, and when the number of the reference logic values included in the additional sampling data exceeds the second reference number, the refresh data determiner determines data obtained by performing an exclusive OR (XOR) operation on the test data, the sampling data, and the additional sampling data as the refresh data.

12. The memory device of claim 6, wherein the second reference number is a value less than the first reference number.

13. The memory device of claim 2, wherein the reference logical value is a logic value indicating memory cells having a threshold voltage higher than the test read voltage among the memory cells.

14. The memory device of claim 6, wherein the refresh program voltage is a program voltage corresponding to a program state having a highest threshold voltage distribution among the plurality of program states.

15. The memory device of claim 7, wherein the refresh program voltage is a voltage higher than a program voltage corresponding to a program state having a highest threshold voltage distribution among the plurality of program states by the sampling step voltage.

16. A method of operating a memory device including memory cells programmed so that each of the memory cells has a threshold voltage corresponding to any one of a plurality of program states, the method comprising:
    obtaining test read data obtained by sensing the memory cells using a test read voltage that is any one read voltage among preset default read voltages; and
    applying a refresh program voltage to some memory cells among the memory cells according to the number of reference logic values included in the test read data.

17. The method of claim 16, wherein applying refresh program voltage comprises:
    obtaining sampling data, which is data obtained by sensing the memory cells using a sampling voltage;
    determining the some memory cells according to whether the number of the reference logical values included in the sampling data exceeds a reference number; and
    applying a refresh program voltage to the some memory cells.

18. The method of claim 17, wherein determining the some memory cells comprises:
    obtaining additional sampling data obtained by sensing the memory cells with an additional sampling voltage obtained by decreasing the sampling voltage by a sampling step voltage in response to the number of the reference logic values included in the sampling data, which is equal to or less than the reference number; and
    determining memory cells corresponding to the reference logic value included in data obtained by sequentially performing an exclusive OR (XOR) operation on the test read data, the sampling data, and the additional sampling data as the some memory cells.

19. The method of claim 17, wherein determining the some memory cells comprises determining memory cells corresponding to the reference logic value included in data obtained by performing an exclusive OR (XOR) operation on the test read data and the sampling data as the some memory cells in response to the number of the reference logical values included in the sampling data, exceeding the reference number.

20. A memory device comprising:
    a memory cell array including memory cells configured to be programmed so that each of the memory cells has a threshold voltage corresponding to one of a plurality of program states;
    a peripheral circuit configured to perform a read operation or a program operation on the plurality of memory cells; and
    a refresh operation controller configured to control the peripheral circuit to perform a refresh program operation for a program state in which the number of memory cells of which a threshold voltage is decreased among the plurality of memory cells exceeds a preset reference number among the plurality of program states.

* * * * *